United States Patent
Chen et al.

(10) Patent No.: US 9,553,599 B1
(45) Date of Patent: Jan. 24, 2017

(54) TECHNIQUES FOR REDUCING OFFSETS IN AN ANALOG TO DIGITAL CONVERTER

(71) Applicant: Analog Devices, Inc., Norwood, MA (US)

(72) Inventors: Baozhen Chen, Woburn, MA (US); Lalinda D. Fernando, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/017,995

(22) Filed: Feb. 8, 2016

(51) Int. Cl.
*H03M 1/06* (2006.01)
*H03M 1/46* (2006.01)
*H03M 1/20* (2006.01)
*H03M 1/42* (2006.01)

(52) U.S. Cl.
CPC ......... *H03M 1/0612* (2013.01); *H03M 1/201* (2013.01); *H03M 1/42* (2013.01); *H03M 1/466* (2013.01)

(58) Field of Classification Search
CPC .... H03M 1/0612; H03M 1/466; H03M 1/201; H03M 1/42; H03M 1/06; H03M 1/1023; H03M 1/203; H03M 1/207; H03M 1/00
USPC ................. 341/161, 144, 118, 155
See application file for complete search history.

(56) References Cited

U.S. PATENT DOCUMENTS

| | | | |
|---|---|---|---|
| 6,556,154 B1 | 4/2003 | Gorecki | |
| 7,015,853 B1 | 3/2006 | Wolff et al. | |
| 7,286,075 B2 | 10/2007 | Hennessy | |
| 7,528,761 B2 | 5/2009 | Draxelmayr | |
| 7,663,518 B2 | 2/2010 | Hurrell | |
| 7,705,755 B2 * | 4/2010 | Yang | H03M 1/109 341/118 |
| 7,956,787 B2 | 6/2011 | Westwick et al. | |
| 7,965,218 B2 * | 6/2011 | Ohnhaeuser | H03M 1/08 341/161 |
| 8,665,125 B2 | 3/2014 | Reinhold et al. | |
| 2009/0273501 A1 | 11/2009 | Madhavan et al. | |
| 2011/0032134 A1 * | 2/2011 | Cho | H03M 1/0682 341/144 |

FOREIGN PATENT DOCUMENTS

WO    WO2007056617 A1    5/2007

* cited by examiner

*Primary Examiner* — Jean B Jeanglaude
(74) *Attorney, Agent, or Firm* — Schwegman Lundberg & Woessner, P.A.

(57) ABSTRACT

In an example, a successive approximation register analog-to-digital converter includes a switched capacitor digital-to-analog converter (DAC) first array to sample an input signal and to convert a sample of the input signal to a digital value represented by a plurality of bits, the first array including a first group of capacitors representing at least some of the plurality of bits, a switched capacitor DAC second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials such that the at least one bit represented by the second group of capacitors is switchable between at least three states.

20 Claims, 4 Drawing Sheets

| BIT 7 | + |
|---|---|
| BIT 6 | − |
| BIT 5 | − |
| BIT 4 | − |
| BIT 3 | − |
| BIT 2 | − |
| BIT 1 | − |
| BIT 0 | − |

FIG. 2A

|   |   |   |
|---|---|---|
|   | − | − |
|   | − | + |
|   | + | + |

FIG. 2B

| BIT 7 | − | + |
|---|---|---|
| BIT 6 | − | + |
| BIT 5 | − | + |
| BIT 4 | − | + |
| BIT 3 | − | + |
| BIT 2 | − | + |
| BIT 1 | − | + |
| BIT 0 | − | + |

FIG. 2C

|   | DAC-L | DAC-R |
|---|---|---|
| BIT 7 | − | + |
| BIT 6 | − | + |
| BIT 5 | − | + |
| BIT 4 | − | + |
| BIT 3 | − | + |
| BIT 2 | − | + |
| BIT 1 | − | + |
| BIT 0 | − | + |

FIG. 2D

| BIT 7 | − | + |
|---|---|---|
| BIT 6 | − | + |
| BIT 5 | − | + |
| BIT 4 | − | + |
| BIT 3 | − | − |
| BIT 2 | − | + |
| BIT 1 | − | − |
| BIT 0 | − | + |

FIG. 2E

| BIT 7 | − | + |
|---|---|---|
| BIT 6 | − | + |
| BIT 5 | − | + |
| BIT 4 | − | + |
| BIT 3 | + | + |
| BIT 2 | − | + |
| BIT 1 | + | + |
| BIT 0 | − | + |

FIG. 2F

| BIT 7 | − |
|---|---|
| BIT 6 | + |
| BIT 5 | + |
| BIT 4 | + |
| BIT 3 | + |
| BIT 2 | − |
| BIT 1 | + |
| BIT 0 | − |

FIG. 2G

TECHNIQUES FOR REDUCING OFFSETS IN AN ANALOG TO DIGITAL CONVERTER

TECHNICAL FIELD

This disclosure relates generally to analog to digital converters.

BACKGROUND

Generally, successive approximation register (SAR) analog to digital converters (ADC) can generate a digital code representing the magnitude of an input voltage ($V_{IN}$). SAR ADCs can operate in two phases, namely a sampling phase and a bit trial phase. During the sampling phase, the input voltage can be acquired. During the bit trial phase, the input voltage can be compared against test voltages to determine whether the input voltage is greater than or less than the respective test voltages. SAR ADCs can operate bit by bit, comparing the input voltage initially to an analog voltage value corresponding to the most significant bit (MSB), deciding upon the value of the MSB and thereafter comparing the input voltage to an analog voltage value representing a combination of the selected MSB and a candidate value for the next lower bit position. The bit trial process operates incrementally across all bit positions from the MSB to the least significant bit (LSB) position until a complete digital code is generated that corresponds to the input voltage.

OVERVIEW

In some examples, this disclosure is directed to a successive approximation register (SAR) analog-to-digital converter (ADC) comprising a switched capacitor digital-to-analog converter (DAC) first array configured to sample an input signal and to convert a sample of the input signal to a digital value represented by a plurality of bits, the first array including a first group of capacitors representing at least some of the plurality of bits. The SAR ADC comprises a switched capacitor DAC second array, the second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials such that the at least one bit of the plurality of bits represented by the second group of capacitors is switchable between at least three states.

In another example, this disclosure is directed to a method of using a digital-to-analog converter (DAC) to correct an offset in a successive approximation register (SAR) analog-to-digital converter (ADC). The method comprises providing a switched capacitor digital-to-analog converter (DAC) array configured to sample an input signal and to convert a sample of the input signal to a digital value represented by a plurality of bits, the plurality of bits including most significant bits (MSBs) and least significant bits (LSBs), the capacitor array including a first group of capacitors representing the LSBs, wherein each of the LSBs are configurable between at least three states including a null state, a positive state and a negative state, setting each of the LSBs of the DAC to a predetermined state, sampling a signal having a known level, performing a SAR conversion of the sampled signal and measuring the offset, and adjusting the state of at least one of the LSBs of the DAC, based on the measured offset, to a specified one of the three states.

In another example, this disclosure is directed to a successive approximation register (SAR) analog-to-digital converter (ADC) comprising a switched capacitor digital-to-analog converter (DAC) first array configured to sample an input signal and to convert a sample of the input signal to a digital value represented by a plurality of bits, the first array including a first group of capacitors representing at least some of the plurality of bits. The SAR ADC comprises a switched capacitor DAC second array, the second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 2A-2G are conceptual diagrams depicting various digital to analog converter states.

DETAILED DESCRIPTION

Figure 1:
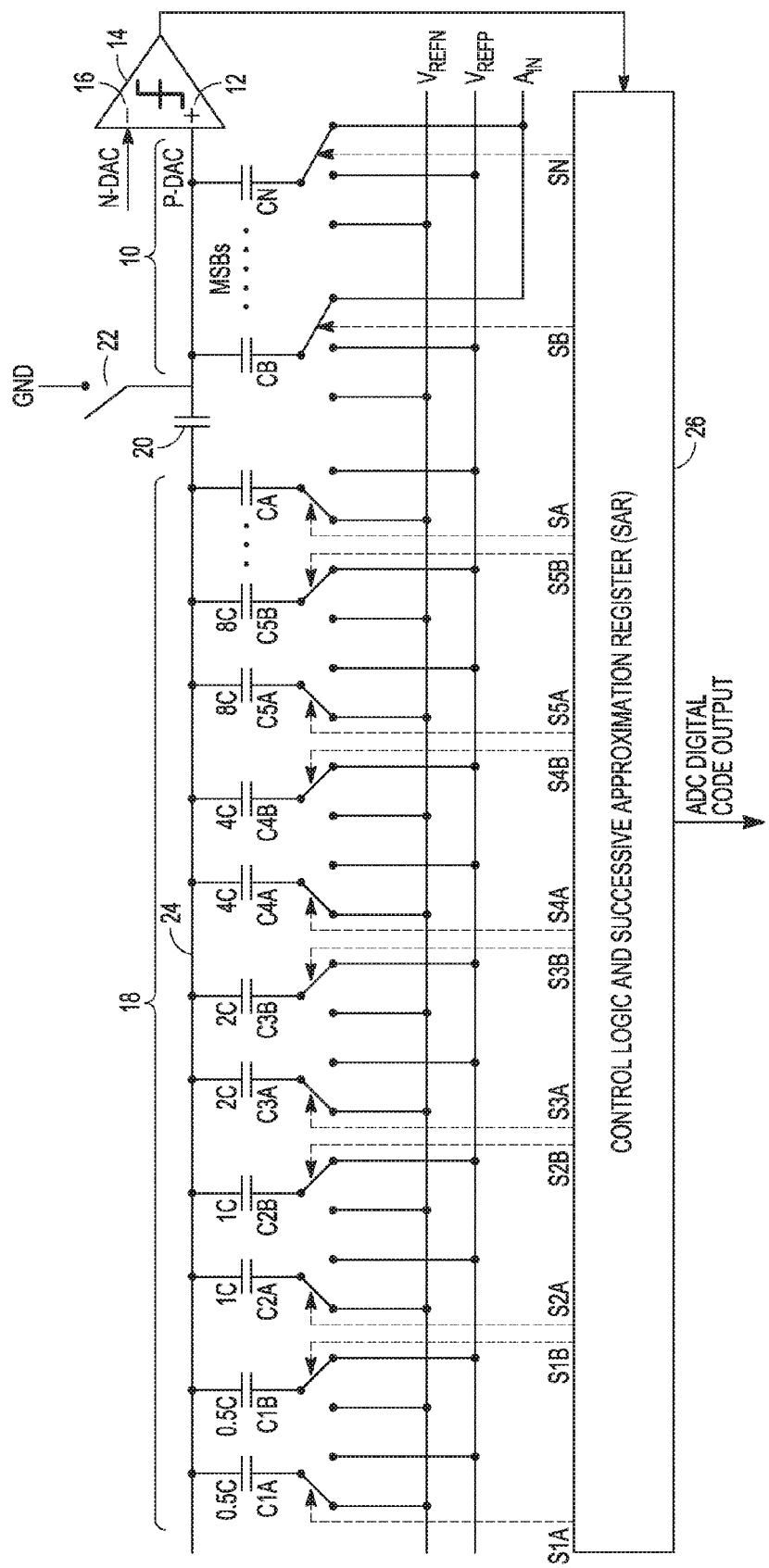
FIG. 1 is a schematic diagram of an example analog to digital converter that can implement various techniques of this disclosure.

It is desirable that an analog to digital converter (ADC) should have a good resolution, but also exhibit good linearity. The resolution of a converter relates to the number of bits that it converts. Typically, high performance ADCs can exhibit 14, 16 or 18 bit resolution. However, a user should also pay attention to other performance metrics of the ADC, such as integral non-linearity (INL) and differential non-linearity (DNL). DNL can refer to the relative step sizes of each discrete code produced by the ADC. Ideally, if a ramped input voltage is supplied to the ADC then each transition from one digital code to the next should be equally spaced along the analog input ramp. However, DNL errors can result in these transitions becoming non-equally spaced. It can therefore be useful to think of the analog values as being sorted into different digital "bins" and therefore each bin should be the same size. The differential non-linearity can be expressed in terms of size of the least significant bit, e.g., DNL of greater than −1 LSB (−1LSB<DNL error).

DNL errors can occur within a successive approximation register (SAR) ADC. The successive approximation algorithm can involve comparing a sampled analog value against a set of trial "weights" using an analog comparator. The largest weight can first be compared (trialed) against the sampled value. If this weight is larger than the sampled analog value then it can be rejected, but if it is less than it can be kept. The next largest weight can then be trialed in the same way and the process can be repeated down from the largest weight to the smallest weight. The weights can be binary weighted.

Although manufacturers take great care to minimize DNL, process variations and limitations on the physical accuracy to which devices can be fabricated almost invariably mean that the capacitors are not weighted exactly correctly after manufacture. For example, instead of being binary weighted, the actual capacitor ratios are unknown. These "offsets" in capacitor weights can skew the measurements, which can lead to DNL errors in the trial bit weights. Additional information regarding DNL errors can be found in commonly assigned U.S. Pat. No. 7,286,075 to Hennessy et al., the entire content of which being incorporated herein by reference.

Some ADCs are calibrated at the factory. For instance, capacitor mismatch can be measured and then the offset measurements can be stored, e.g., using fuses or one-time programmable devices, and then the offset values for individual capacitors can be added to the conversion results.

There is a demand, however, for on-chip calibration in SAR ADCs to minimize the performance parametric shift over various environmental variations, e.g., temperature changes, and life time. Charge balance calibration, using the charge of lower bits to balance out the charge of the bit under calibration, may be a promising candidate for on-chip calibration.

It can be desirable to calibrate as deep as Bit 4, for example, where Bit 15 is the most significant bit (MSB) and Bit 0 is the least significant bit (LSB). Calibration down to such a depth can present a challenge because the calibration range can be limited at lower bits, e.g., the offset of the ADC can over range the calibration range. For example, Bit 6 has a bit weight of 64 LSBs while the available range, which is the sum of Bit 5 to Bit 0 including a redundancy bit, can be around 80 LSBs. If the ADC is offset by more than 16 LSB, the calibration can be out of range. The offset of the ADC can come from various sources, including the comparator offset, the digital to analog converter (DAC) random mismatch, for example. There is a need to accurately control the offsets to calibrate the ADC.

The switched capacitor architecture used in many SAR ADCs can be used to impose a perturbation or a dither onto the sampled signal. For example, a dither DAC can be used to add a known dither to the operation of the ADC, which can improve the DNL errors.

The dither DAC can also be used to adjust the offset. However, nulling out the offset accurately can be challenging at least because of two issues. First, the dither DAC may not be calibrated so it has a raw DNL. Second, the dither DAC can have a gain error compared to the main DAC of the SAR ADC. For an on-chip calibration including first and second DACs, e.g., dither DAC and main DAC, one of the two DACs should be selected to calibrate first. If the main DAC is selected for calibration, then an un-calibrated dither DAC is used when calibrating the main DAC. If the dither DAC is selected for calibration, then an uncalibrated main DAC is used when calibrating the dither DAC. The raw DNL of the dither DAC can be large enough that DNL error itself could outweigh the ADC offset. This again can cause the calibration to be out of range.

This disclosure is directed to, among other things, techniques to minimize or null offsets in an ADC, e.g., SAR ADC, using a DAC, e.g., a dither DAC. A first switched capacitor DAC, e.g., main DAC, and a second switched capacitor DAC, e.g., dither DAC, can include capacitors representing the plurality of bits of the digital code generated that correspond to the input analog voltage. As described in detail below, for one or more bits in the second DAC, e.g., one or more LSBs in the dither DAC, instead of existing techniques that place one capacitor representing a bit in one of two states, e.g., positive (+) and negative (−) states, in accordance with various techniques of this disclosure, at least one of the bits represented by the group of capacitors of the second DAC, e.g., dither DAC, is represented by at least two capacitors. In other words, using various techniques of this disclosure, one capacitor representing a bit in the digital code can instead be configured as two capacitors representing a bit, where each capacitor represents one half of the bit.

Each of the two (or more) capacitors representing a bit can be configured to be selectively connected to one of at least two reference potentials, e.g., positive (+Vref) and negative reference (−Vref) voltages, such that the one or more bits of the plurality of bits represented by the group of capacitors of the second DAC is switchable between at least three states. These three (or more) states can be implemented as follows: one or more bits (capacitors), can each be split into at least two equally weighted half elements. When both halves are selectively connected to sample+Vref, the state is (+,+); when both halves are selectively connected to sample −Vref, the state is (−,−); when one half is selectively connected to sample +Vref and the other half is selectively connected to sample −Vref, the state is (−,+) or (−,+). Various techniques described in this disclosure can reduce the error due to gain error between the first DAC and the second DAC, e.g., dither DAC and main DAC, and can avoid large DNL error.

FIG. 1 is a schematic diagram of an example ADC that can implement various techniques of this disclosure. An ADC can include two switched capacitor arrays, one designated "P-DAC" and generally designated 10 and connected to the non-inverting input 12 of a comparator 14. An equivalent switched capacitor array, designated "N-DAC" can be connected to the inverting input 16 of the comparator 14. The arrays are identical and, for simplicity and conciseness, only one need be described. Indeed, the operation of the ADC can be understood more simply if it is assumed that the "N-DAC" array is omitted and that the inverting input 16 is connected to a reference voltage, e.g., ground.

In some example implementations, the switched capacitor DAC array shown in FIG. 1 can be implemented as a segmented DAC array to overcome a scaling problem associated with scaling weighted capacitors, e.g., binary weighted capacitors, over N bits of an N bit converter. As shown in FIG. 1, the segmented DAC array of FIG. 1 can be divided such that a first DAC array 10, e.g., a main or primary array, can include a first group of capacitors CB through CN, e.g., representing the MSBs of the digital value represented by a plurality of bits can be provided in a first DAC array 10, e.g., a main or primary array, and a second DAC array 18, e.g., a dither DAC or dither DAC sub array, can include a second group of capacitors C1A, C1B, C2A, C2B . . . CA, e.g., representing the LSBs of the digital value represented by the plurality of bits. The capacitors within any array can be weighted with respect to one another, e.g., binary weighted, but the scaling between arrays can be broken and the correct relative sizes of the capacitors restored by the appropriate sizing of a bridge capacitor 20 that can connect the second DAC array 18 to the first DAC array 10.

SAR conversion can include two phases, namely a sampling phase and a bit trial phase. During the sampling phase, the input voltage can be acquired. During the bit trial phase, the input voltage can be compared against test voltages to determine whether the input voltage is greater than or less than the respective test voltages. SAR ADCs can operate bit by bit, comparing the input voltage initially to an analog voltage value corresponding to the MSB, deciding upon the value of the MSB and thereafter comparing the input voltage to an analog voltage value representing a combination of the selected MSB and a candidate value for the next lower bit position. The bit trial process operates incrementally across all bit positions from the MSB to the LSB position until a complete digital code is generated that corresponds to the input voltage.

The switch capacitor DAC first array 10 can be configured to sample an input signal and to convert a sample of the input signal to a digital value or code represented by a plurality of bits. More particularly, the capacitors CB to CN of the switch capacitor DAC first array 10 can be connected by switches SB to SN, respectively, to an input signal path "Ain" in order to allow an input voltage to be sampled onto the capacitors CB to CN.

During sampling, a switch 22 can be closed so as to connect the second plates of the capacitors (the uppermost ones as shown in FIG. 1) to ground or some other suitable reference voltage. The switch 22 can be open at other times. It can be seen that, in a segmented converter of the type shown in FIG. 1, it is not necessary to sample the input voltage onto the capacitors C1A to CA of the second array 18, e.g., the dither DAC.

Each of the capacitors CB to CN of the first switched capacitor DAC array 10 has an associated switch SB to SN that is operable to selectively connect a first plate, e.g., the lowermost plate of the capacitors as shown in FIG. 1, to either a first reference voltage "Vrefp" or to a second reference voltage "Vrefn". Generally Vrefn corresponds to ground and Vrefp is positive relative to Vrefn.

As indicated above, in some example implementations, the second DAC array 18 can include a dither DAC sub array. As is known to those of ordinary skill in the art, dither can be introduced into the ADC by modifying the switch positions during sampling such that some of the lower capacitor bit weights in the P-DAC sub array 18, e.g., dither DAC, have their first plates connected to Vrefp during the sampling phase rather than being connected to Vrefn. When the switches are connected back to Vrefn at some time during the successive approximation conversion process and, in some example implementations, before the most significant bit CN is tested, a charge redistribution can occur that creates a negative perturbation to the voltage at the common rail 24 of the second DAC array 18 that, in turn, can cause a negative perturbation to be introduced into the first DAC array 10 via the bridge capacitor 20, thereby causing a slight but known change in the voltage sampled on to the first array 10. Applying the same dither technique to the N-DAC sub array can produce a positive perturbation to the sampled input. The dither can be introduced by altering the switches S1A to SA of any of the capacitors C1A to CA of the sub array 18 although, in general, it can be desirable for the dither to be kept small. It can therefore be seen that selective switching of capacitors within the sub capacitor array 18 can be used to perturb the voltage that was sampled onto the main capacitor array 10 during the sampling phase and hence introduce a positive or negative dither into the ADC without complicating the analog signal path within the converter.

As mentioned above and in accordance with this disclosure, at least one of the bits represented by the group of capacitors C1A, C1B, C2A, C2B . . . CA in the second switched capacitor DAC array 18, e.g., LSBs in the dither DAC, is represented by at least two capacitors. In FIG. 1, the capacitor pair C1A and C1B can together represent a first bit in a digital code, e.g., a first LSB. Similarly, the capacitor pair C2A and C2B can together represent a second bit, the capacitor pair C3A and C3B can together represent a third bit, the capacitor pair C4A and C4B can together represent a fourth bit, the capacitor pair C5A and C5B can together represent a fifth bit, and so forth up to a pair represented by capacitor CA. There could be more than five capacitor pairs or fewer than five capacitor pairs.

In some example implementations, the capacitors can be binary weighted with respect to one another. For example, in FIG. 1, the capacitor pair C1A and C1B can be the least significant capacitor pair and can together have a capacitance value of 1 arbitrary unit, or 0.5 arbitrary units each (shown in FIG. 1 as 0.5 C). The next most significant capacitor pair C2A and C2B can together have a capacitance value of 2 arbitrary units, or 1 arbitrary unit each (shown in FIG. 1 as 1C). The next most significant capacitor pair C3A and C3B can together have a capacitance value of 4 arbitrary units, or 2 arbitrary units each (shown in FIG. 1 as 2C). The next most significant capacitor pair C4A and C4B can together have a capacitance value of 8 arbitrary units, or 4 arbitrary units each (shown in FIG. 1 as 4C). The next most significant capacitor pair C5A and C5B can together have a capacitance value of 16 arbitrary units, or 8 arbitrary units each (shown in FIG. 1 as 8C), and so forth.

In accordance with various techniques of this disclosure, each capacitor of one or more capacitor pairs in the second switched capacitor DAC array 18, e.g., LSBs in the dither DAC, has an associated switch, e.g., switches S1A to SA, that is operable to connect a first plate, e.g., the lowermost plate of the capacitors as shown in FIG. 1, to either a first reference voltage "Vrefp" or to a second reference voltage "Vrefn". Generally Vrefn corresponds to ground. Each of the two capacitors in a capacitor pair representing a bit, e.g., capacitors C1A and C1B, can be configured to be selectively connected to one of at least two reference potentials, e.g., positive (Vrefp) and negative reference (Vrefn) voltages, such that the bit can be switchable between at least three states. For example, if switches S1A, S1B are both connected to Vrefp, then the capacitor pair C1A, C1B has a first state (+,+), e.g., a positive state. If switches S1A, S1B are both connected to Vrefn, then the capacitor pair C1A, C1B has a second state (−, −), e.g., a negative state. If switch S1A is connected to Vrefp and switch S1B is connected to Vrefn, then the capacitor pair C1A, C1B has a third state (+, −), e.g., a null state. If switch S1A is connected to Vrefn and switch S1B is connected to Vrefp, then the capacitor pair C1A, C1B has a fourth state (−, +), e.g., a null state.

Dividing each bit represented by one capacitor into two half bits, each represented by a capacitor, as in the example shown in FIG. 1, can convert a bi-polar DAC, e.g., a DAC that is configured to add dither in a positive or negative sense in a conversion process after calibration, to two DACs in which each DAC can exclusively add a positive or negative offset, respectively, during a calibration process. One advantage of such a split is that the effect of the dither DAC raw DNL can be minimized so that offsets can be measured and nulled accurately. As described below, a refinement control loop can also be used to achieve a targeted accuracy. By enabling accurate control of the offset, the techniques of this disclosure can allow on-chip calibration to deeper bits.

Before continuing with the description of FIG. 1, it will be helpful to consider the conceptual diagrams shown in FIGS. 2A-2G. FIG. 2A shows an example of an 8-bit dither DAC without the splitting techniques described above with respect to FIG. 1. In FIG. 2A, the 8-bit DAC is initialized to midscale (10000000) where Bit 7 is in a positive state (+) and Bit 6-Bit 0 are in a negative state (−).

FIG. 2B shows three of the four states mentioned above with respect to FIG. 1, namely a positive state (+,+), a negative state (−, −), and a null state (−, +) that can be employed using the techniques of this disclosure. FIG. 2C shows an example of an eight bit dither DAC with the splitting techniques described in this disclosure. In FIG. 2C, the 8-bit DAC shown is initialized such that Bit 7-Bit 0 are in a null state (−,+). It should be noted that null state (+, −) is similar to null state (−, +). Conceptually, as depicted in FIG. 2D, the single dither DAC of FIG. 2A can be split into two dither DACs using the techniques of this disclosure, where one DAC ("DAC R") adds positive offset and the other DAC ("DAC L") adds negative offset. In FIG. 2D, the two DACs are initialized to a null state. Again, this split can reduce the effect of dither DAC raw DNL.

The process of reducing or nulling the offset can now be described. Initially, a first DAC array, e.g., array 10 of FIG. 1, can sample a signal having a known value or level, e.g., a differential zero signal, and the capacitors C1A, C1B, C2A, C2B, etc. in the second DAC array, e.g. array 18 of FIG. 1, can be set to an initial state, e.g., a null state of (−, +) by selectively controlling their respective switches S1A, S1B, S2A, S2B, etc. using a control logic and successive approximation register 26 (also referred to as "control logic 26" or "SAR 26") that controls the switch positions in a manner known to those of ordinary skill in the art to perform a SAR conversion. For example, the control logic 26 can set the dither DAC bits to a (−, +) null state (as shown in FIGS. 2C and 2D) measure the ADC offset. For an 8-bit DAC, e.g., dither DAC, the code can be set to {(−,+), (−,+), (−,+), (−,+), (−,+), (−, +), (−,+), (−,+)} instead of {+, −, −, −, −, −, −, −,} (as shown in FIG. 2A) or {−, +, +, +, +, +, +, +,}.

Next, the control logic 26 can perform a SAR conversion on the sampled signal and the offset can be measured using the comparator 14 and stored in SAR 26. SAR conversion techniques are well known to those of ordinary skill in the art and, for purposes of conciseness, will not be described in detail herein. Example SAR conversion techniques are described in commonly assigned U.S. Pat. No. 7,286,075 to Hennessy et al., the entire content of which being incorporated herein by reference. In some example implementations, a group of bits of the first DAC array, e.g., bits of the first array 10, can be used to sample the signal. As the first DAC array 10 may not be calibrated, the measured offset may be a rough estimate and, as such, a target accuracy level may not be reached.

Based on the measured offset stored in the SAR 26, the control logic 26 can adjust the state of at least one of the LSBs of the second DAC array 18 to a specified one of at least three states by controlling one or more of the switches S1A, S1B, etc., thereby loading the measured offset into the second DAC array 18. For example, if the offset is 5LSB, the code can be changed from {(−,+), (−,+), (−,+), (−,+), (−,+), (−,+), (−,+), (−,+)} to ((−,+), (−,+), (−,+), (−,+), (−,−), (−,+), (−,−), (−,+)), as shown in FIG. 2E. If the offset is −5LSB, the code can be changed to {(−,+), (−,+), (−,+), (−,+), (+,+), (−,+), (+,+),(−,+)}, as shown in FIG. 2F.

As seen in this example, two lower bits were changed or actively used. By keeping the most significant bits (MSBs) of the dither DAC silent, the errors due to DNL of the dither DAC, which are likely to be maximized at MSB transitions, can be reduced tremendously. From the view of "DAC L" and "DAC R", if the measured offset is +5LSB, Bit3 and Bit1 of "DAC R" are flipped. If the measured offset is −5LSB, Bit3 and Bit1 of "DAC L" are flipped.

Compare the example described above using the techniques of this disclosure in which each bit can be split into two half bits to an example that does not use these techniques. To measure the offset, an 8-bit dither DAC can be initialized to midscale of {+, −, −, −, −, −, −, −,} or {−, +, +, +, +, +, +, +,}. If the dither DAC is set to {+, −, −, −, −, −, −, −,} as in FIG. 2A and the offset is measured to be 5LSB, then the dither DAC should be set to {−, +, +, +, +, −, +, −}, as shown in FIG. 2G. As can be seen, in contrast to using the techniques of this disclosure, all of the upper bits of the dither DAC have been changed, which can result in a large DNL error.

In some example implementations, it can be desirable to further refine the offset. As mentioned above, based on the measured offset stored in the SAR 26, the control logic 26 can adjust the state of at least one of the LSBs of the second DAC array 18 to a specified one of at least three states by selectively controlling one or more of the switches S1A, S1B, S2A, etc., thereby loading the measured offset into the second DAC array 18. The first DAC array, e.g., array 10 of FIG. 1, can again sample the signal having a known value or level, e.g., a differential zero signal.

Next, the control logic 26 can perform a SAR conversion on the sampled signal and another offset can be measured using the comparator 14 and stored in the SAR 26. The control logic 26 can add this new measured offset to the offset measured in the prior trials to generate a cumulative offset. The control logic 26 can adjust the state of at least one of the LSBs of the second DAC array 18, based on the cumulative offset, to one of the positive state and the negative state, and another round of refinement can performed until a specified accuracy is achieved, e.g., less than 5LSB. That is, the control loop formed by the DAC arrays 18, 10, the comparator 14, and the control logic and successive approximation register 26 can iteratively repeat these acts of sampling, SAR conversion, adding offsets, and adjusting states until the cumulative offset meets a specified accuracy, e.g., offset less than 5LSB. The refinement achieved using the control loop can reduce or remove any error due to gain errors between the second DAC array 18 and the first DAC array 10.

In some example implementations, the control logic 26 can include memory (not depicted) that is configured to store the determined offset. During an on-chip calibration operation, the control logic can load the determined offset into the second DAC array 18 by adjusting the state of at least one of the LSBs of the second DAC array 18, as described above, to reduce or eliminate offset.

Figure 3:
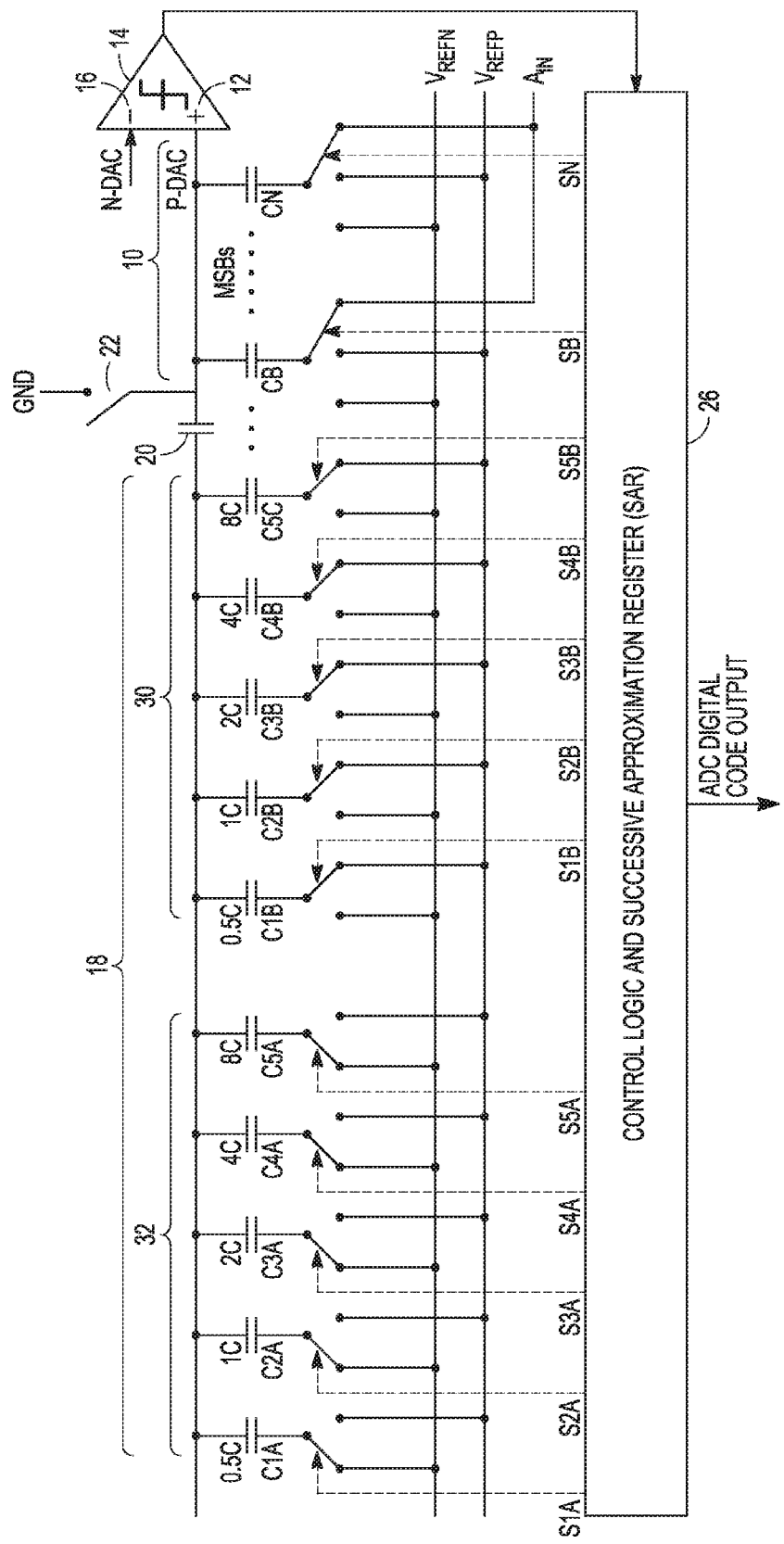
FIG. 3 is a schematic diagram of another example analog to digital converter that can implement various techniques of this disclosure.

FIG. 3 is a schematic diagram of another example analog to digital converter that can implement various techniques of this disclosure. Many of the features of the SAR ADC of FIG. 3 are similar to the example SAR ADC shown and described above with respect to FIG. 1 and, for purposes of conciseness, will not be described in detail again.

In contrast to the ADC of FIG. 1, the example configuration shown in FIG. 3 depicts that the switched capacitor DAC second array 18 can include two DAC arrays 30, 32. As seen in FIG. 3, the DAC sub array 18 of FIG. 1, e.g., a dither DAC or dither DAC sub array, can itself be split into at least two separate sub arrays 30, 32. The switches S1A, S2A, S3A, S4A, S5A, etc. of sub array 30 can be selectively connected using the control logic 26 to Vrefp to add positive offset and the switches S1B, S2B, S3B, S4B, S5B, etc. of sub array 30 can be selectively connected using the control logic 26 to Vrefn to add negative offset, as described above. The techniques described above with respect to FIG. 1 for using the switched capacitor DAC array 18 to correct an offset in a SAR ADC are applicable to the switched capacitor DAC arrays 30, 32 and, for purposes of conciseness, will not be described in detail again.

Figure 4:
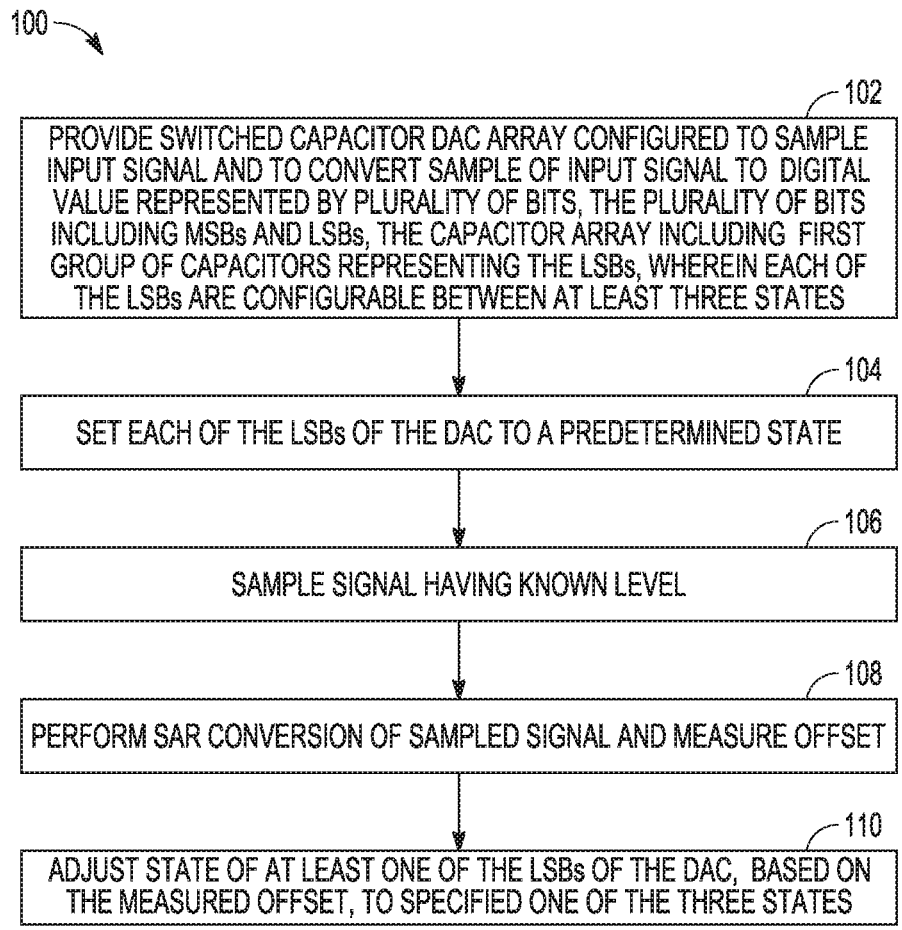
FIG. 4 is a flow diagram of an example of a method for reducing offsets in an analog to digital converter, in accordance with this disclosure.

FIG. 4 is a flow diagram of an example of a method for reducing offsets in an analog to digital converter, in accordance with this disclosure. The method 100 shown in FIG. 4 can use a digital-to-analog converter to correct an offset in a successive approximation register analog-to-digital converter (ADC). At block 102, the method can include providing a switched capacitor digital-to-analog converter (DAC) array configured to sample an input signal, e.g., the P-DAC array of FIG. 1, and to convert a sample of the input signal to a digital value represented by a plurality of bits, the plurality of bits including most significant bits (MSBs) and least significant bits (LSBs), the capacitor array including a first group of capacitors representing the LSBs, wherein each of the LSBs are configurable between at least three states including a null state, a positive state and a negative state. At block 104, the method can include setting each of the LSBs of the DAC to a predetermined state, e.g., the control logic 26 setting each of the capacitors C1A, C1B, C2A, C3A, etc. of FIG. 1 to a predetermined state using switches S1A, S1B, etc. of FIG. 1.

At block 106, the control logic, e.g., the control logic 26 of FIG. 1, can control the ADC of FIG. 1 to sample a signal having a known level, e.g., a differential zero signal. Next, at block 108, a SAR converter, e.g., SAR converter 26 of FIG. 1 can perform a SAR conversion of the sampled signal and measure the offset. At block 110, the control logic, e.g., the control logic 26, can adjust the state of at least one of the LSBs of the DAC, based on the measured offset, to a specified one of the at least three states.

Using these techniques, offset can be adjusted to a targeted accuracy even though an uncalibrated dither DAC was used. These techniques can enable accurate control of offset so the on-chip calibration can be achieved at deeper bit levels.

VARIOUS EXAMPLES AND NOTES

Example 1 includes subject matter (such as a device, circuit, apparatus, or machine) that can include or use a successive approximation register (SAR) analog-to-digital converter (ADC) comprising a switched capacitor digital-to-analog converter (DAC) first array configured to sample an input signal and to convert a sample of the input signal to a digital value represented by a plurality of bits, the first array including a first group of capacitors representing at least some of the plurality of bits; a switched capacitor DAC second array, the second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials such that the at least one bit of the plurality of bits represented by the second group of capacitors is switchable between at least three states.

In Example 2, the subject matter of Example 1 may optionally include, wherein the at least two reference potentials include a positive reference voltage and a negative reference voltage, and wherein the at least three states include a positive state, a negative state, and a null state.

In Example 3, the subject matter of one or more of Examples 1 and 2 may optionally include, wherein the at least two reference potentials include a positive reference voltage and a negative reference voltage, wherein each of the at least two capacitors include a first plate, and wherein each first plate is configured to be selectively connected to a selected one of the positive reference voltage and the negative reference voltage.

In Example 4, the subject matter of one or more of Examples 1-3 may optionally include, wherein the plurality of bits includes most significant bits (MSBs) and least significant bits (LSBs), wherein the second group of capacitors represents the LSBs.

In Example 5, the subject matter of Example 4 may optionally include, wherein each bit of the LSBs is represented by two capacitors, wherein each of the at least two capacitors is configured to be selectively connected to a selected one of the two reference potentials such that the at least one bit of the plurality of bits represented by the second group of capacitors is switchable between the at least three states.

In Example 6, the subject matter of one or more of Examples 1-5 may optionally include, wherein the first array is connected to the second array via a bridge capacitor.

In Example 7, the subject matter of one or more of Examples 1-6 may optionally include, wherein the switched capacitor DAC second array is configurable as a dither DAC to generate an offset to add to the input signal in an analog domain.

Example 8 includes subject matter (such as a method, means for performing acts, machine readable medium including instructions that when performed by a machine cause the machine to performs acts, or an apparatus configured to perform) of using a digital-to-analog converter (DAC) to correct an offset in a successive approximation register (SAR) analog-to-digital converter (ADC), the method comprising: providing a switched capacitor digital-to-analog converter (DAC) array configured to sample an input signal and to convert a sample of the input signal to a digital value represented by a plurality of bits, the plurality of bits including most significant bits (MSBs) and least significant bits (LSBs), the capacitor array including a first group of capacitors representing the LSBs, wherein each of the LSBs are configurable between at least three states including a null state, a positive state and a negative state; setting each of the LSBs of the DAC to a predetermined state; sampling a signal having a known level; performing a SAR conversion of the sampled signal and measuring the offset; and adjusting the state of at least one of the LSBs of the DAC, based on the measured offset, to a specified one of the three states.

In Example 9, the subject matter of Example 8 may optionally include, wherein the measured offset is a first measured offset, the method comprising: sampling the calibration signal; performing a SAR conversion of the sampled signal and measuring a second offset adding the second offset to the first offset to generate a cumulative offset; and adjusting the state of at least one of the LSBs of the DAC, based on the cumulative offset, to one of the positive state and the negative state.

In Example 10, the subject matter of Example 9 may optionally include, using a control loop and iteratively repeating the sampling, performing, adding, and adjusting.

In Example 11, the subject matter of Example 9 may optionally include, using a control loop and iteratively repeating the sampling, performing, adding, adjusting and applying until the cumulative offset meets a specified accuracy.

In Example 12, the subject matter of one or more of Examples 8-11 may optionally include, wherein each bit of the LSBs is represented by a first capacitor and a second capacitor, wherein each first capacitor includes a first capacitor first plate and each second capacitor includes a second capacitor first plate, and wherein setting each of the LSBs of the DAC to a predetermined state includes: connecting each first capacitor first plate to one of a positive reference voltage and a negative reference voltage and connecting each second bottom plate to one of the positive reference voltage and the negative reference voltage.

In Example 13, the subject matter of Example 12 may optionally include, wherein the predetermined state is the null state, and wherein setting each of the LSBs of the DAC to the null state includes: connecting each first capacitor first plate to a positive reference voltage and connecting each second bottom plate to a negative reference voltage.

In Example 14, the subject matter of Example 12 may optionally include, wherein adjusting the state of at least one of the LSBs of the DAC, based on the measured offset, to one of the positive state and the negative state, includes at least one of: connecting at least one of the first capacitor first plate and the second capacitor first plate to a negative reference voltage; and connecting at least one of the first capacitor first plate and the second capacitor first plate to a positive reference voltage.

In Example 15, the subject matter of one or more of Examples 8-14 may optionally include, wherein the capacitor array includes a second group of capacitors representing at least some of the MSBs, wherein the MSBs are configurable between two states, and wherein the states of the MSBs are not adjusted to correct the offset.

In Example 16, the subject matter of one or more of Examples 8-15 may optionally include, wherein the DAC is initially uncalibrated.

In Example 17, the subject matter of one or more of Examples 8-16 may optionally include, wherein providing a switched capacitor digital-to-analog converter (DAC) array includes: providing a switched capacitor digital-to-analog converter (DAC) array including a main DAC and dither DAC.

Example 18 includes subject matter (such as a device, circuit, apparatus, or machine) that can include or use a successive approximation register (SAR) analog-to-digital converter (ADC) comprising a switched capacitor digital-to-analog converter (DAC) first array configured to sample an input signal and to convert a sample of the input signal to a digital value represented by a plurality of bits, the first array including a first group of capacitors representing at least some of the plurality of bits; a switched capacitor DAC second array, the second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials.

In Example 19, the subject matter of Example 18 may optionally include, wherein the at least two reference potentials include a positive reference voltage and a negative reference voltage, and wherein the at least three states include a positive state, a negative state, and a null state.

In Example 20, the subject matter of Example 18 may optionally include, wherein the at least two reference potentials include a positive reference voltage and a negative reference voltage, wherein each of the at least two capacitors include a first plate, and wherein each first plate is configured to be selectively connected to a selected one of the positive reference voltage and the negative reference voltage.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A successive approximation register (SAR) analog-to-digital converter (ADC) comprising:
    a switched capacitor digital-to-analog converter (DAC) first array configured to sample an input signal and to convert a sample of the input signal to a digital value represented by a plurality of bits, the first array including a first group of capacitors representing at least some of the plurality of bits;
    a switched capacitor DAC second array, the second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials such that the at least one bit of the plurality of bits represented by the second group of capacitors is switchable between at least three states,
    wherein the at least three states include a positive state, a negative state, and a null state.

2. The SAR ADC of claim 1, wherein the at least two reference potentials include a positive reference voltage and a negative reference voltage.

3. The SAR ADC of claim 1, wherein the at least two reference potentials include a positive reference voltage and a negative reference voltage, wherein each of the at least two capacitors include a first plate, and wherein each first plate is configured to be selectively connected to a selected one of the positive reference voltage and the negative reference voltage.

4. The SAR ADC of claim 1, wherein the plurality of bits includes most significant bits (MSBs) and least significant bits (LSBs), wherein the second group of capacitors represents the LSBs.

5. The SAR ADC of claim 4, wherein each bit of the LSBs is represented by two capacitors, wherein each of the at least two capacitors is configured to be selectively connected to a selected one of the two reference potentials such that the at least one bit of the plurality of bits represented by the second group of capacitors is switchable between the at least three states.

6. The SAR ADC of claim 1, wherein the first array is connected to the second array via a bridge capacitor.

7. The SAR ADC of claim 1, wherein the switched capacitor DAC second array is configurable as a dither DAC to generate an offset to add to the input signal in an analog domain.

8. A method of using a digital-to-analog converter (DAC) to correct an offset in a successive approximation register (SAR) analog-to-digital converter (ADC), the method comprising:
    providing a switched capacitor digital-to-analog converter (DAC) array configured to sample an input signal and to convert a sample of the input signal to a digital value represented by a plurality of bits, the plurality of bits including most significant bits (MSBs) and least significant bits (LSBs), the capacitor array including a first group of capacitors representing the LSBs, wherein each of the LSBs is represented by at least two capacitors, wherein each of the two capacitors is configured to be selectively connected to a selected one of at least two reference potentials such that each of the LSBs is configurable between at least three states including a null state, a positive state and a negative state;
    setting each of the LSBs of the DAC to a predetermined state;
    sampling a signal having a known level;
    performing a SAR conversion of the sampled signal and measuring the offset; and
    adjusting the state of at least one of the LSBs of the DAC, based on the measured offset, to a specified one of the three states.

9. The method of claim 8, wherein the measured offset is a first measured offset, the method comprising:
    sampling the calibration signal;
    performing a SAR conversion of the sampled signal and measuring a second offset;
    adding the second offset to the first offset to generate a cumulative offset; and
    adjusting the state of at least one of the LSBs of the DAC, based on the cumulative offset, to one of the positive state and the negative state.

10. The method of claim 9, comprising:
    using a control loop and iteratively repeating the sampling, performing, adding, and adjusting.

11. The method of claim 9, comprising:
    using a control loop and iteratively repeating the sampling, performing, adding, adjusting and applying until the cumulative offset meets a specified accuracy.

12. The method of claim 8, wherein each bit of the LSBs is represented by a first capacitor and a second capacitor, wherein each first capacitor includes a first capacitor first plate and each second capacitor includes a second capacitor first plate, and wherein setting each of the LSBs of the DAC to a predetermined state includes:
    connecting each first capacitor first plate to one of a positive reference voltage and a negative reference voltage and connecting each second bottom plate to one of the positive reference voltage and the negative reference voltage.

13. The method of claim 12, wherein the predetermined state is the null state, and wherein setting each of the LSBs of the DAC to the null state includes:
    connecting each first capacitor first plate to a positive reference voltage and connecting each second bottom plate to a negative reference voltage.

14. The method of claim 12, wherein adjusting the state of at least one of the LSBs of the DAC, based on the measured offset, to one of the positive state and the negative state, includes at least one of:

connecting at least one of the first capacitor first plate and the second capacitor first plate to a negative reference voltage; and connecting at least one of the first capacitor first plate and the second capacitor first plate to a positive reference voltage.

15. The method of claim 8, wherein the capacitor array includes a second group of capacitors representing at least some of the MSBs, wherein the MSBs are configurable between two states, and wherein the states of the MSBs are not adjusted to correct the offset.

16. The method of claim 8, wherein the DAC is initially uncalibrated.

17. The method of claim 8, wherein providing a switched capacitor digital-to-analog converter (DAC) array includes:

providing a switched capacitor digital-to-analog converter (DAC) array including a main DAC and dither DAC.

18. A successive approximation register (SAR) analog-to-digital converter (ADC) comprising:

a switched capacitor digital-to-analog converter (DAC) first array configured to sample an input signal and to convert a sample of the input signal to a digital value represented by a plurality of bits, the first array including a first group of capacitors representing at least some of the plurality of bits;

a switched capacitor DAC second array, the second array including a second group of capacitors representing at least some of the plurality of bits, wherein at least one bit of the plurality of bits represented by the second group of capacitors is represented by at least two capacitors, and wherein each of the two capacitors is configured to be selectively connected to a selected one of at least two reference potentials.

19. The SAR ADC of claim 18, wherein the at least two reference potentials include a positive reference voltage and a negative reference voltage, and wherein the at least three states include a positive state, a negative state, and a null state.

20. The SAR ADC of claim 18, wherein the at least two reference potentials include a positive reference voltage and a negative reference voltage, wherein each of the at least two capacitors include a first plate, and wherein each first plate is configured to be selectively connected to a selected one of the positive reference voltage and the negative reference voltage.

* * * * *